(12) United States Patent
Law et al.

(10) Patent No.: US 10,056,292 B2
(45) Date of Patent: Aug. 21, 2018

(54) SELF-ALIGNED LITHOGRAPHIC PATTERNING

(71) Applicant: GLOBALFOUNDRIES Inc., Grand Cayman (KY)

(72) Inventors: Shao Beng Law, Watervliet, NY (US); Genevieve Beique, Clifton Park, NY (US); Frank W. Mont, Troy, NY (US); Lei Sun, Albany, NY (US); Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/359,037

(22) Filed: Nov. 22, 2016

(65) Prior Publication Data

US 2018/0144979 A1 May 24, 2018

(51) Int. Cl.
| | |
|---|---|
| *H01L 21/44* | (2006.01) |
| *H01L 21/768* | (2006.01) |
| *H01L 21/3065* | (2006.01) |
| *H01L 21/308* | (2006.01) |

(52) U.S. Cl.
CPC .... *H01L 21/76877* (2013.01); *H01L 21/3065* (2013.01); *H01L 21/3081* (2013.01); *H01L 21/76802* (2013.01)

(58) Field of Classification Search
None
See application file for complete search history.

(56) References Cited

U.S. PATENT DOCUMENTS

| | | | |
|---|---|---|---|
| 9,281,212 B1 | 3/2016 | Glodde et al. | |
| 9,368,350 B1 | 6/2016 | He et al. | |
| 9,478,462 B1* | 10/2016 | Wang | H01L 21/76898 |
| 2007/0020928 A1 | 1/2007 | Albertson et al. | |
| 2007/0170574 A1* | 7/2007 | Lauxtermann | H01L 21/76898 |
| | | | 257/686 |
| 2008/0032508 A1 | 2/2008 | Chang | |
| 2011/0117723 A1 | 5/2011 | Seidel et al. | |
| 2012/0282779 A1 | 11/2012 | Arnold et al. | |
| 2014/0148012 A1 | 5/2014 | Guillorn et al. | |
| 2014/0315380 A1 | 10/2014 | Kanakasabapathy et al. | |
| 2015/0048430 A1* | 2/2015 | He | H01L 21/31111 |
| | | | 257/288 |
| 2015/0243518 A1* | 8/2015 | deVilliers | H01L 21/0337 |
| | | | 438/692 |

(Continued)

OTHER PUBLICATIONS

Shao Beng Law et al., U.S. Appl. No. 15/360,255, filed Nov. 23, 2016 entitled Post Spacer Self-Aligned Cuts.

(Continued)

*Primary Examiner* — Bradley K Smith
(74) *Attorney, Agent, or Firm* — Thompson Hine LLP; Anthony Canale (57) ABSTRACT

Methods of lithographic patterning. A metal hardmask layer is formed on a dielectric layer and a patterned layer is formed on the metal hardmask layer. A metal layer is formed on an area of the metal hardmask layer exposed by an opening in the patterned layer. After the metal layer is formed, the patterned layer is removed from the metal hardmask layer. After the patterned layer is removed, the metal hardmask layer is patterned with the metal layer masking the metal hardmask layer over the area.

20 Claims, 5 Drawing Sheets

(56) References Cited

U.S. PATENT DOCUMENTS

2017/0018499 A1    1/2017  Chen et al.

OTHER PUBLICATIONS

Shao Beng Law et al., U.S. Appl. No. 15/457,200, filed Mar. 13, 2017 entitled Non-Mandrel Cut Formation.
USPTO, Office Action dated Mar. 21, 2018 in U.S. Appl. No. 15/457,200.
USPTO, final Office Action issued in U.S. Appl. No. 15/360,255 dated Jan. 11, 2018.
USPTO, Office Action issued in U.S. Appl. No. 15/360,255 dated Jul. 3, 2017.
USPTO, Notice of Allowance issued in U.S. Appl. No. 15/360,255 dated May 18, 2018.

* cited by examiner

SELF-ALIGNED LITHOGRAPHIC PATTERNING

BACKGROUND

The present invention relates to integrated circuits and semiconductor device fabrication and, more specifically, to methods of lithographic patterning.

A back-end-of-line (BEOL) interconnect structure may be used to electrically couple device structures fabricated on a substrate during front-end-of-line (FEOL) processing. The BEOL interconnect structure may be formed using a dual-damascene process in which via openings and trenches etching in a dielectric layer are simultaneously filled with metal to create a metallization level. In a via-first, trench-last dual damascene process in which via openings are formed in a dielectric layer and then a trench is formed in the dielectric layer above the via openings, the via openings are unfilled during the etching process forming the trenches. In a single-damascene process, the via openings and trench are formed in different dielectric layers and filled separately with metal.

Self-aligned patterning processes involve the use of mandrels as sacrificial structures. Sidewall spacers, which have a thickness less than that permitted by the current ground rules for optical lithography, are formed on the vertical sidewalls of the mandrels. After selective removal of the mandrels, the sidewall spacers are used as an etch mask to etch an underlying hardmask and dielectric layer, for example, with a directional reactive ion etching (RIE). Because the sidewall spacers may have a sublithographic line pitch and width, the features formed in underlying dielectric layer will also have a sublithographic line pitch and width.

Cuts may be formed in mandrels with a cut mask and etching in order to section the mandrels and define gaps that subsequently are used to form adjacent wires that are spaced apart at their tips with a tip-to-tip spacing. The pattern of the cut mandrels is transferred to a hardmask used to pattern a dielectric layer. Cuts may also be formed in the hardmask itself and filled by spacer material when sidewall spacers are formed on the mandrels. These cuts are also transferred to the hardmask and are reflected in the patterned dielectric layer.

Improved methods of lithographic patterning are needed.

SUMMARY

In an embodiment of the invention, a method includes forming a metal hardmask layer on a dielectric layer, forming a patterned layer on the metal hardmask layer, and forming a metal layer on an area of the metal hardmask layer exposed by an opening in the patterned layer. After the metal layer is formed, the patterned layer is removed from the metal hardmask layer. After the patterned layer is removed, the metal hardmask layer is patterned with the metal layer masking the metal hardmask layer over the area.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
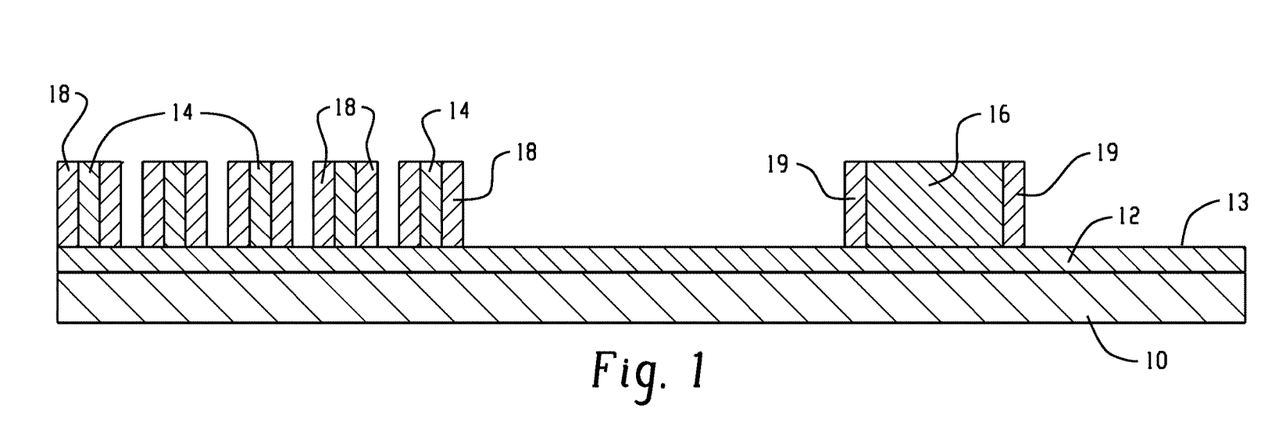
FIGS. 1-4 are cross-sectional views of a structure at successive stages of a processing method in accordance with embodiments of the invention.

With reference to FIG. 1 and in accordance with embodiments of the invention, a dielectric layer 10 is processed according to the processing method to form an interconnect structure of a metallization level. The dielectric layer 10 may be composed of an electrically-insulating dielectric material, such as hydrogen-enriched silicon oxycarbide (SiCOH) produced from an octamethylcyclotetrasiloxane (OMCTS) precursor or another type of low-k dielectric material. The dielectric layer 10 may be located on a substrate comprised of, for example, a semiconductor material suitable for forming an integrated circuit and including device structures fabricated by front-end-of-line (FEOL) processing to form the integrated circuit. The dielectric layer 10 may include a capping layer (not shown) of, for example, silicon nitride ($Si_3N_4$) that protects the integrity of the dielectric layer 10 during metal hardmask patterning.

A hardmask layer 12 is located on the top surface of the dielectric layer 10. The hardmask layer 12 may be comprised of a metal, such as titanium nitride (TiN) deposited by a physical vapor deposition (PVD) process. The hardmask layer 12 is removable from the dielectric layer 10 without inflicting damage to the dielectric layer 10.

Mandrels 14, 16 are formed on the top surface of the hardmask layer 12. The mandrels 14, 16 may be concurrently formed by depositing a blanket layer of a material on the entire top surface of the hardmask layer 12 and patterning the layer by lithography and etching using a lithography stack. For example, a sidewall image transfer (SIT) technique may be used to pattern the mandrels 14, 16. The dimensions of mandrel 16 may be greater than the dimensions of mandrels 14. The mandrels 14, 16 may be composed of silicon, such as amorphous silicon, deposited at a low temperature by chemical vapor deposition (CVD).

Sidewall spacers 18 are formed at locations on the top surface 13 of the hardmask layer 12 adjacent to the vertical sidewalls of the mandrels 14. Sidewall spacers 19 are formed at locations on the top surface 13 of the hardmask layer 12 adjacent to the vertical sidewalls of the mandrel 16. The sidewall spacers 18, 19 and the mandrels 14, 16 are arranged lengthwise in parallel rows on the top surface 13 of the hardmask layer 12.

The sidewall spacers 18, 19 may be concurrently formed by depositing a conformal layer comprised of a dielectric material on the mandrels 14, 16 and the top surface 13 of hardmask layer 12 where exposed by the mandrels 14, 16, and shaping the conformal layer with an anisotropic etching process, such as reactive ion etching (RIE), that preferentially removes the dielectric material from horizontal surfaces, such as the top surfaces of the hardmask layer 12 and the mandrels 14, 16. The material constituting the sidewall spacers 18, 19 may be chosen to be selectively removed relative to the mandrels 14, 16 through the use of a suitable etch chemistry. As used herein, the term "selective" in reference to a material removal process (e.g., etching) denotes that the material removal rate (i.e., etch rate) for the targeted material is higher than the material removal rate (i.e., etch rate) for at least another material exposed to the material removal process. The sidewall spacers 18, 19 may be comprised of a dielectric material, such as silicon dioxide (SiO$_2$) deposited by atomic layer deposition (ALD).

Figure 2:
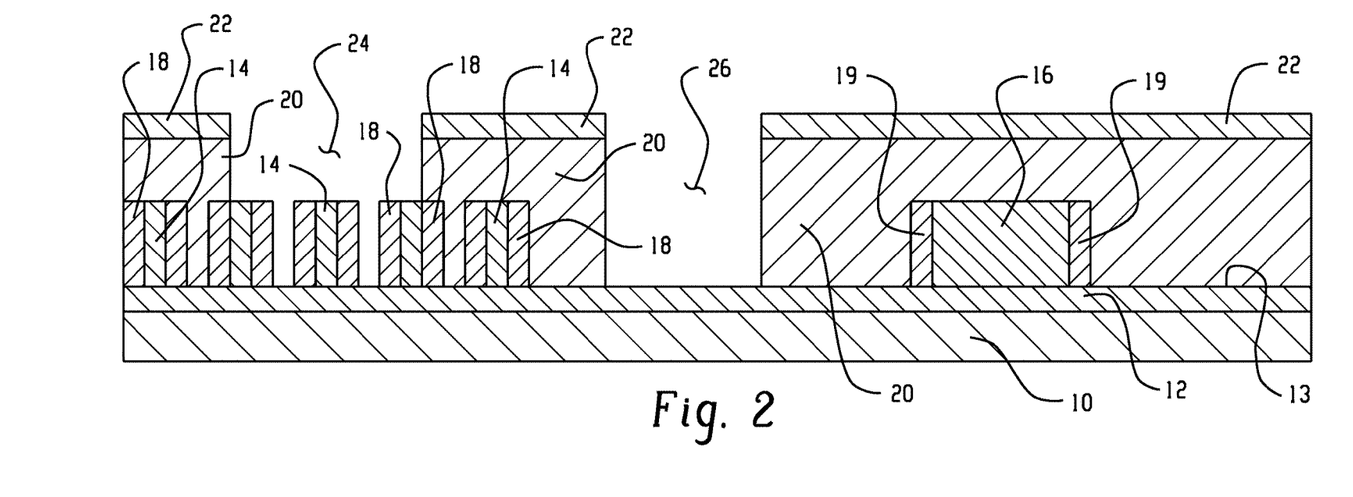

With reference to FIG. 2 in which like reference numerals refer to like features in FIG. 1 and at a subsequent fabrication stage, a layer 20 composed of an organic planarization layer (OPL) material may be spin coated on the top surface 13 of hardmask layer 12, followed by the application of a layer of a spin-on, silicon hardmask material (not shown) and a photoresist layer 22. Alternatively, the layer 20 may be composed of a dielectric material, such as silicon oxynitride (SiON), followed by the application of a bottom anti-reflective coating and the photoresist layer 22.

The photoresist layer 22 is patterned by exposure to a pattern of radiation from an exposure source projected through a photomask, and developed with a chemical developer to form openings 24, 26 that are situated at the intended locations for further processing as described below. With the patterned photoresist layer present, the layer 20 is stripped at the locations of the openings 24, 26 using an etching process, such as reactive-ion etching (ME), with the material of the hardmask layer 12 functioning as an etch stop. The opening 24 exposes some of the mandrels 14 and their associated sidewall spacers 18, as well as areas on the top surface 13 of the hardmask layer 12 between the sidewall spacers 18. The opening 26 exposes an area horizontally between the mandrel 16 and one of the mandrels 14. The area exposed by opening 26 is featureless in that it is free of spacers and mandrels.

Figure 3:
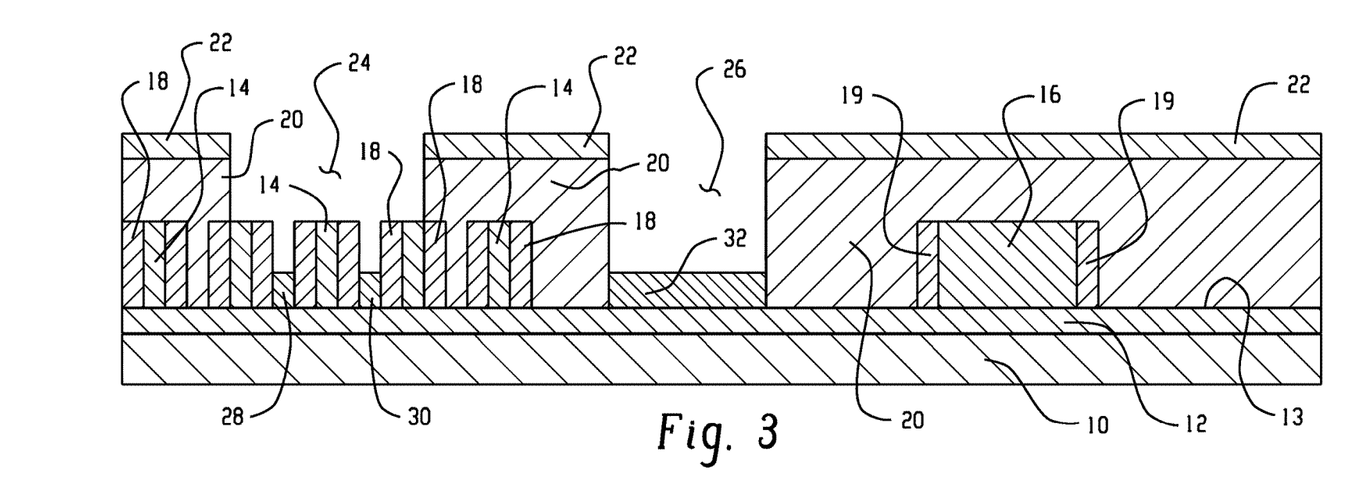

With reference to FIG. 3 in which like reference numerals refer to like features in FIG. 2 and at a subsequent fabrication stage, sections 28, 30, 32 of an etch mask layer 34 are formed on the top surface 13 of the hardmask layer 12 at locations exposed by the removal of the OPL layer 20 inside the openings 24, 26. The sections 28, 30, 32 of the layer 34 have a lower surface that contacts, and is coextensive with, the top surface 13 of the hardmask layer 12. Each of the sections 28, 30, 32 has an area inside outer edges defining an outer boundary that covers an equal area on the top surface 13 of the hardmask layer 12. The sections 28, 30 of the etch mask layer 34 are coextensive at the outer boundary with the nearest-neighbor sidewall spacers 18 on adjacent mandrels 14 exposed inside opening 24. Section 32 of the etch mask layer 34 is coextensive at the outer boundary with the sidewalls of the OPL layer 20 bordering the opening 26.

In an embodiment, the etch mask layer 34 may be composed of a metal, such as ruthenium (Ru) formed using a volatile metal precursor of ruthenium deposited by low-temperature CVD or atomic layer deposition (ALD). In an embodiment, the etch mask layer 34 may be composed of a metal, such as cobalt (Co) formed using a volatile metal precursor of cobalt deposited by low-temperature CVD or atomic layer deposition (ALD). In embodiments, the etch mask layer 34 may have a thickness that is less or equal to the height of the sidewall spacers 18. The thickness of the etch mask layer 34 may be independent of the dimensions of the area in which each of its sections 28, 30, 32 is deposited. The etch mask layer 34 may be formed by selective deposition using CVD or ALD such that its material selectively deposits by nucleation on surfaces of the hardmask layer 12 to form the sections 28, 30, 32 inside the openings 24, 26, but fails to nucleate and form on the top surfaces of non-metal objects, such as sidewall spacers 18 and mandrels 14, exposed inside opening 24.

Figure 4:
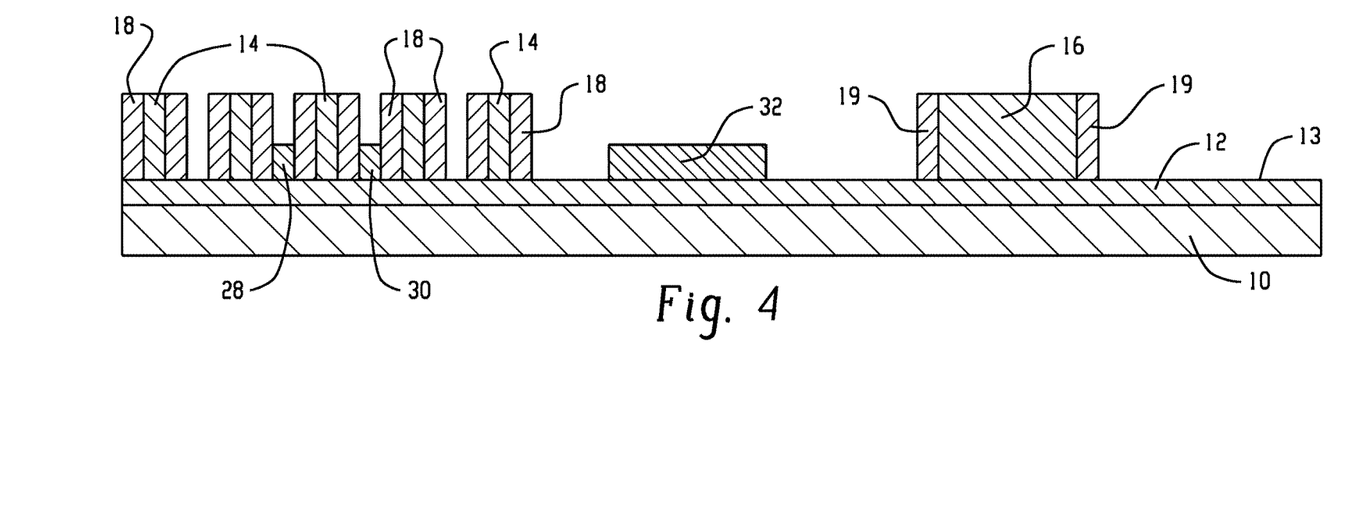

With reference to FIG. 4 in which like reference numerals refer to like features in FIG. 3 and at a subsequent fabrication stage, the OPL layer 20 is stripped to expose the mandrels 14, the mandrel 16, the sidewall spacers 18 on the top surface 13 of the hardmask layer 12 adjacent to the vertical sidewalls of the mandrels 14, and the sidewall spacers 19 on the top surface 13 of the hardmask layer 12 adjacent to the vertical sidewalls of the mandrel 16. The sections 28, 30, 32 of the etch mask layer 34 also remain on the top surface 13 of the hardmask layer 12 after the OPL layer 20 is stripped. The sections 28, 30, 32 of the etch mask layer 34 provide tone inversion during trench lithography for the non-mandrel cut used to determine the pattern of metallization formed in the dielectric layer 10.

Figure 5:
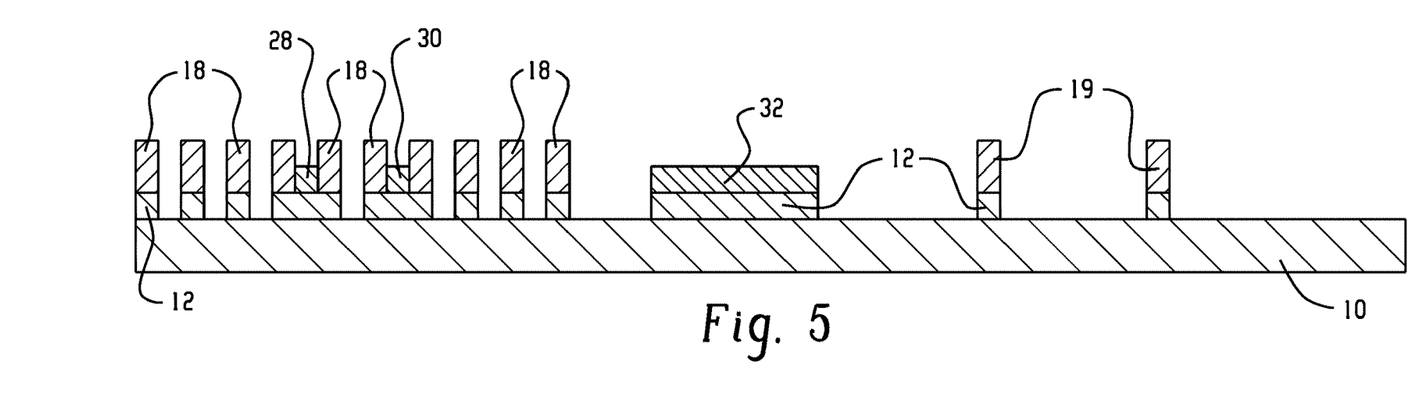
FIG. 5 is a cross-sectional view of the structure at a stage of the processing method subsequent to FIG. 4.
Figure 6:
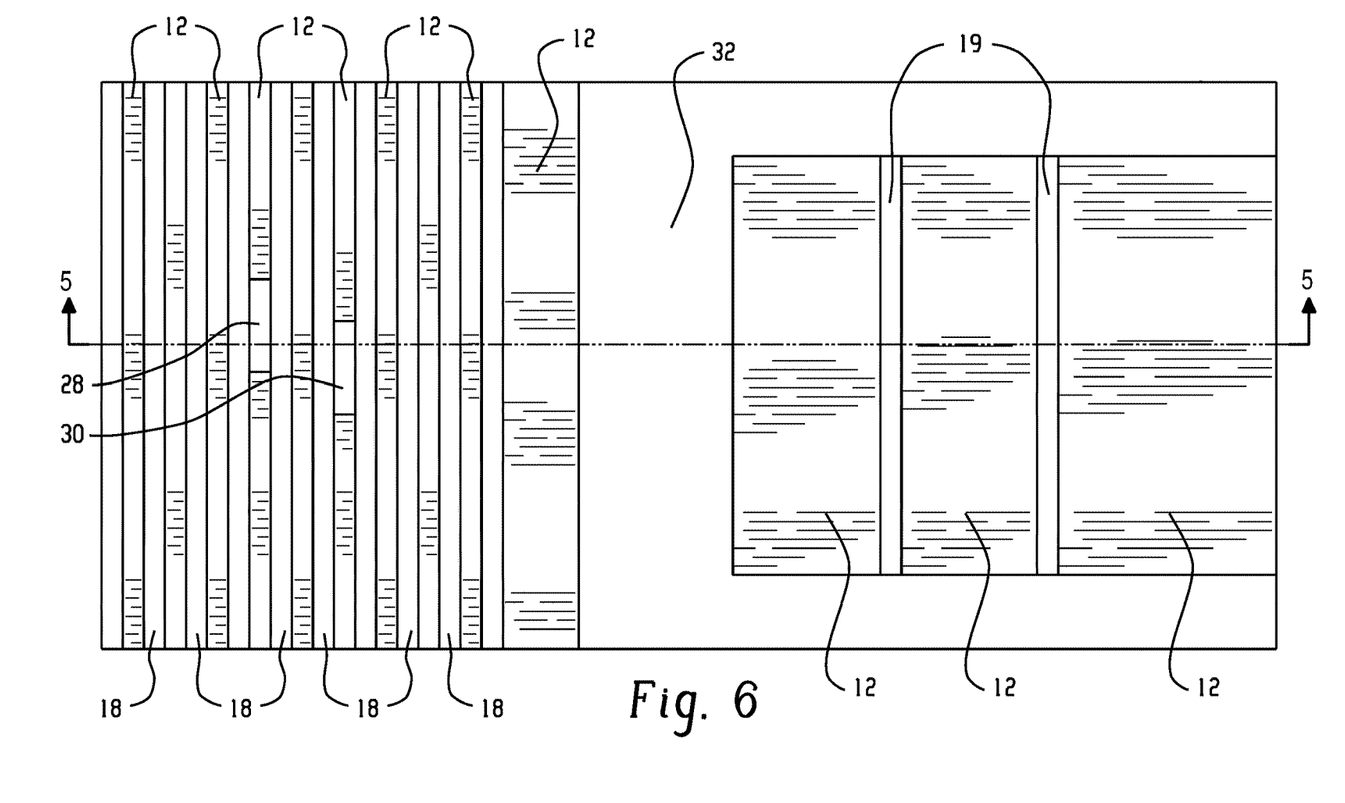
FIG. 6 is a top view of the structure of FIG. 5, which is taken generally along line 5-5 in FIG. 6.

With reference to FIGS. 5 and 6 in which like reference numerals refer to like features in FIG. 4 and at a subsequent fabrication stage, the mandrels 14, 16 are removed selective to the sidewall spacers 18, 19 with an etching process having a suitable etch chemistry. The hardmask layer 12 is exposed over areas from which the mandrels 14, 16 are pulled. After the mandrels 14, 16 are removed, the hardmask layer 12 is patterned by an etching process with the sidewall spacers 18, 19 and the sections 28, 30, 32 of the etch mask layer 34 operating as an etch mask. The etching process removes the material of the hardmask layer 12 selective to the materials of the sidewall spacers 18, 19 and the etch mask layer 34, and selective to the material of the dielectric layer 10.

Areas of the hardmask layer 12 are covered by the sidewall spacers 18, 19 and the etch mask layer 34. Sections of the hardmask layer 12 are preserved and retained during its etching in elongated strips over the areas covered by the sidewall spacers 18, 19. Sections of the hardmask layer 12 are likewise preserved and retained during its etching over the areas covered by the sections 28, 30 of the etch mask layer 34. The sections 28, 30 of the etch mask layer 34 and the patterned section of the hardmask layer 12 underlying these sections 28, 30 have equal areas. Each of the sections 28, 30 of the etch mask layer 34 is located between a nearest-neighbor pair of sidewall spacers 18, and the areas covered by sections 28, 30 are bounded in one direction (e.g., width) by these nearest-neighbor sidewall spacers 18. In a direction (e.g., length) that is parallel to the length of the sidewall spacers 18, the sections 28, 30 of the etch mask layer 34 have an arbitrary length that is selected by the dimensions (e.g., width and length) of the openings 24, 26 in the OPL layer 20 (FIG. 3). In an embodiment, the length of the sections 28, 30 of the etch mask layer 34 can be greater than twice the width of the sidewall spacers 18.

The hardmask layer 12 is also preserved and retained during its etching over an area covered by the section 32 of the etch mask layer 34. The section 32 of the etch mask layer 34 and the patterned section of the hardmask layer 12 underlying this sections 32 have equal areas. The metal of the etch mask layer 34 may also be deposited on additional areas of the hardmask layer 12, such as areas on the hardmask layer 12 that are adjacent to the opposite ends of sidewall spacers 19.

The dielectric layer 10 is subsequently etched to form trenches except for those areas masked by the hardmask layer 12 and protected against removal by etching. Those masked areas on the dielectric layer 10 are determined by the patterning of the hardmask layer 12 based in part on complementary areas covered by the sections 28, 30, 32 of the etch mask layer 34.

Figure 7:
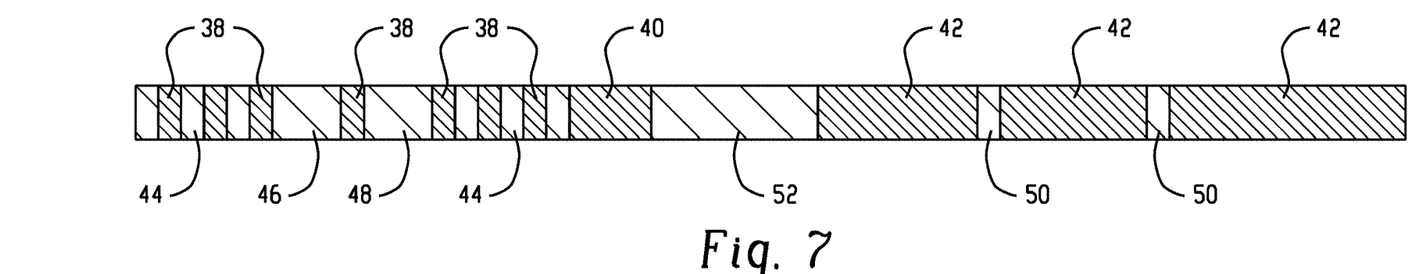
FIG. 7 is a cross-sectional view of the structure at a stage of the processing method subsequent to FIG. 5.
Figure 8:
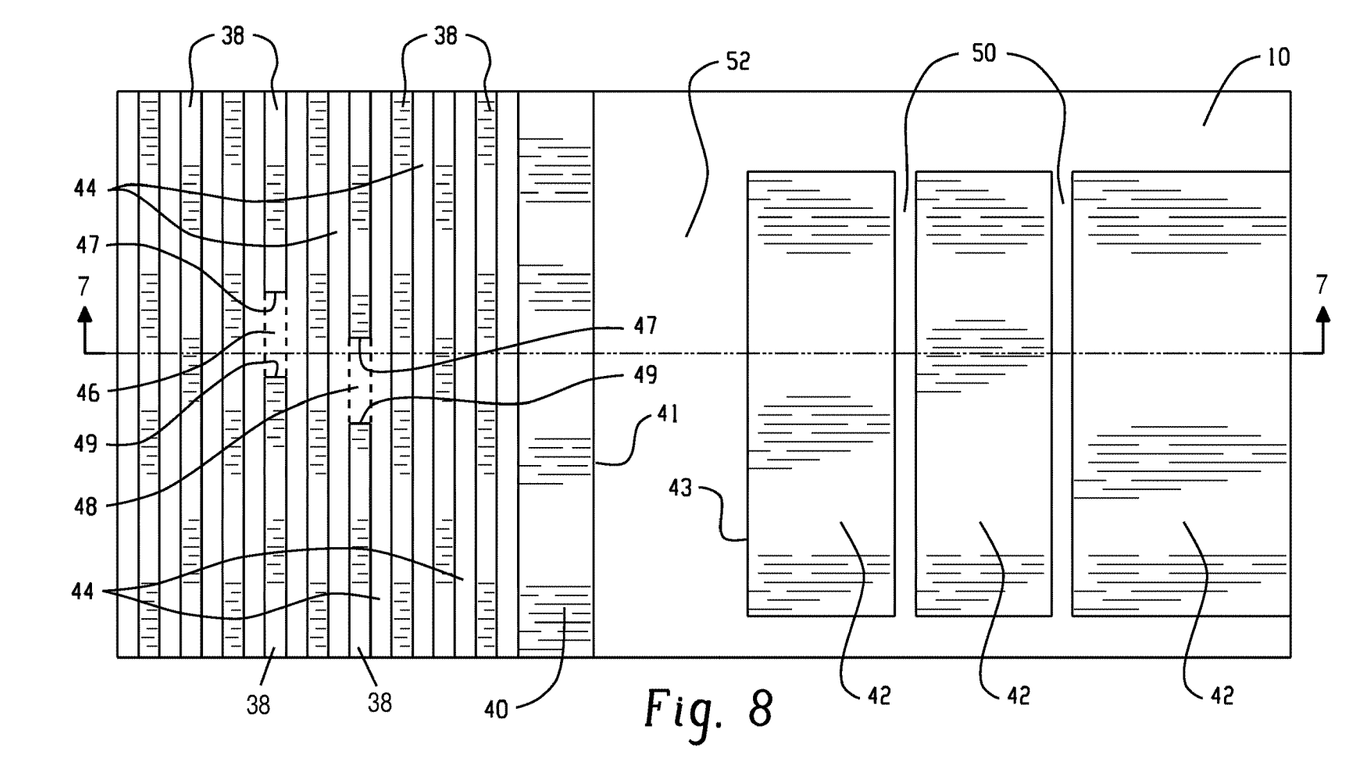
FIG. 8 is a top view of the structure of FIG. 7, which is taken generally along line 7-7 in FIG. 8.

With reference to FIGS. 7 and 8 in which like reference numerals refer to like features in FIGS. 5 and 6 and at a subsequent fabrication stage, the sidewall spacers 18, 19, and the sections 28, 30, 32 of the etch mask layer 34 may be removed by one or more etching processes. Specifically, the dielectric layer 10 is etched using the hardmask layer 12 as a patterned etch mask to remove the dielectric layer 10 in unmasked areas and thereby form trenches in the dielectric layer 10. Those masked areas in which the dielectric layer 10 is not etched, and therefore retained, are determined by the areas of the hardmask layer 12 that are covered by the etch mask layer 34 and the sidewall spacers 18, 19 when the hardmask layer 12 is patterned. After the dielectric layer 10 is etched, the hardmask layer 12 may be selectively removed by an etching or cleaning process. In an alternative embodiment, the sidewall spacers 18, 19 and the sections 28, 30, 32 of the etch mask layer 34 may be retained on the patterned hardmask layer 12 when the dielectric layer 10 is etched.

The trenches in the dielectric layer 10 are filled with a conductor to form wires 38, 40, 42 of different dimensions. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches before filling with the metal. The wires 38, 40, 42 may be comprised of a low-resistivity conductor formed using a deposition process, such as a metal like copper (Cu) formed by electroplating or electroless deposition.

The shapes and geometries of the wires 38, 40, 42 reproduce the shapes and geometries of the patterned features in the hardmask layer 12, which are established by the shapes and geometries of the sections 28, 30, 32 of the etch mask layer 34 and the shapes and geometries of the sidewall spacers 18, 19. Adjacent pairs of the wires 38 are separated from each other by strips 44 of the electrical insulator of the dielectric layer 10. When the dielectric layer 10 is etched, these strips 44 are masked by strips of the hardmask layer 12 preserved over areas of the hardmask layer 12 masked during its patterning by the sidewall spacers 18.

Adjacent strips 44 are bridged and joined by a section 46 of the electrical insulator of the dielectric layer 10 at the locations of a cut defining a discontinuity in one of the wires 38. Section 46 of the dielectric layer 10 is masked and retained at the area of the patterned hardmask layer 12 masked during its patterning by the section 28 of the etch mask layer 34. Adjacent strips 44 are bridged and joined by a section 48 of the electrical insulator of the dielectric layer 10 at the locations of a cut defining a discontinuity in another of the wires 38. Section 48 of the dielectric layer 10 is masked and retained at the area of the hardmask layer 12 masked during its patterning by the section 30 of the etch mask layer 34.

The wires 38 that are interrupted by the section 46 of the dielectric layer 10 have tips or ends 47, 49 that are separated by the section 46 of dielectric layer 10. The wires 38 that are interrupted by the section 48 of the dielectric layer 10 likewise have tips or ends 47, 49 that are separated by the section 48 of dielectric layer 10. The sections 46, 48 are comprised of the dielectric material of the dielectric layer 10 and have dimensions (e.g., length and width) equal to the dimensions of the sections 28, 30 of the etch mask layer 34 (FIG. 5).

The wires 42 are wider than wires 38, and may function as, for example, pad layers. Adjacent pairs of the wires 42 are separated from each other by strips 50 of the electrical insulator of the dielectric layer 10. When the dielectric layer 10 is etched, these strips 50 are masked by strips of the hardmask layer 12 preserved over areas of the hardmask layer 12 masked during its patterning by the sidewall spacers 19.

The wire 40, which is also wider than the wires 38, is located between the wires 38 and the wires 42. Wire 40 has a side edge 41 that is separated from a side edge 43 of the nearest wire 42 by a strip 52 of the electrical insulator of the dielectric layer 10. When the dielectric layer 10 is etched, this strip 52 is masked by a strip of the hardmask layer 12 over an area of the hardmask layer 12 masked during its patterning by the section 32 of the etch mask layer 34. The dimensions of the section 32 of the etch mask layer 34 (FIG. 5) determine the lateral spacing between the side edge 41 of wire 40 and the side edge 43 of the wire 42 that is adjacent to wire 40.

The embodiments of the invention facilitate a non-mandrel cut without the use of a gap-fill layer. This improvement eliminates the need for a gap-fill material that exhibits acceptable behavior during planarization with CMP and/or etch-back and that is compatible with the materials of the mandrel, spacers, and hardmask layer.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a metal hardmask layer on a dielectric layer;
   forming a first mandrel and a second mandrel on the metal hardmask layer;
   forming a patterned layer over the metal hardmask layer, the first mandrel, and the second mandrel;
   selectively depositing a metal layer on a first area of the metal hardmask layer exposed by a first opening in the patterned layer;
   removing the patterned layer from the metal hardmask layer; and
   after the patterned layer is removed, patterning the metal hardmask layer with the metal layer masking the metal hardmask layer over the first area.

2. The method of claim 1 further comprising:
   forming a first sidewall spacer on the first mandrel; and
   forming a second sidewall spacer on the second mandrel,
   wherein the first area masked by the metal layer is located between the first sidewall spacer and the second sidewall spacer.

3. The method of claim 2 wherein the first sidewall spacer and the second sidewall spacer mask the metal hardmask layer when the metal hardmask layer is patterned.

4. The method of claim 2 wherein the metal layer is selectively deposited after the first sidewall spacer and the second sidewall spacer are formed.

5. The method of claim 2 wherein the first sidewall spacer and the second sidewall spacer are comprised of a dielectric material, and the metal layer selectively deposits on the metal hardmask layer without depositing on surfaces of the first sidewall spacer and the second sidewall spacer.

6. The method of claim 2 further comprising:
   selectively depositing the metal layer on a second area of the metal hardmask layer exposed by a second opening in the patterned layer.

7. The method of claim 6 wherein the second area is larger than the first area, and the second area is not located between the first sidewall spacer and the second sidewall spacer.

8. The method of claim 2 further comprising:
   after the metal hardmask layer is patterned, etching the dielectric layer to form a trench between the first sidewall spacer and the second sidewall spacer,
   wherein a section of the dielectric layer is masked during etching by the first area of the metal hardmask layer and defines a cut in the trench.

9. The method of claim 8 further comprising:
   filling the trench with a conductor layer to form a first wire having an end and a second wire having an end separated from the end of the first wire by the section of the dielectric layer.

10. The method of claim 1 wherein the metal hardmask layer is comprised of titanium nitride, and the metal layer is comprised of ruthenium.

11. The method of claim 1 wherein the metal hardmask layer is comprised of titanium nitride, and the metal layer is comprised of cobalt.

12. The method of claim 1 wherein the patterned layer is comprised of a dielectric material, and the metal layer deposits on the metal hardmask layer without depositing on surfaces of the dielectric material.

13. The method of claim 1 further comprising:
    after the metal hardmask layer is patterned, etching the dielectric layer to form a first trench and a second trench spaced laterally from the first trench,
    wherein a section of the dielectric layer is masked during etching by the first area of the metal hardmask layer.

14. The method of claim 13 further comprising:
    filling the first trench with a conductor layer to form a first wire having a side edge; and
    filling the second trench with the conductor layer to form a second wire having a side edge,
    wherein the side edge of the first wire is separated from the side edge of the second wire by the section of the dielectric layer.

15. The method of claim 1 wherein the patterned layer is removed from the metal hardmask layer after the metal layer is selectively deposited.

16. A method comprising:
    forming a metal hardmask layer on a dielectric layer;
    forming a patterned layer on the metal hardmask layer;
    forming a metal layer on a first area of the metal hardmask layer exposed by a first opening in the patterned layer;
    removing the patterned layer from the metal hardmask layer;
    after the patterned layer is removed, patterning the metal hardmask layer with the metal layer masking the metal hardmask layer over the first area; and
    after the metal hardmask layer is patterned, etching the dielectric layer to form a trench,
    wherein a section of the dielectric layer is masked during etching by the metal layer over the first area of the metal hardmask layer and defines a cut in the trench.

17. The method of claim 16 further comprising:
    filling the trench with a conductor layer to form a first wire with an end and a second wire with an end separated from the end of the first wire by the section of the dielectric layer.

18. The method of claim 16 wherein the patterned layer is removed from the metal hardmask layer after forming the metal layer.

19. A method comprising:
    forming a metal hardmask layer on a dielectric layer;
    forming a patterned layer on the metal hardmask layer;
    forming a metal layer on a first area of the metal hardmask layer exposed by a first opening in the patterned layer;
    forming the metal layer on a second area of the metal hardmask layer exposed by a second opening in the patterned layer;
    removing the patterned layer from the metal hardmask layer; and
    after the patterned layer is removed, patterning the metal hardmask layer with the metal layer masking the metal hardmask layer over the first area and over the second area,
    wherein the second area is larger than the first area.

20. The method of claim 19 wherein the patterned layer is removed from the metal hardmask layer after forming the metal layer.

* * * * *